United States Patent
Yamada

(10) Patent No.: US 6,890,782 B2
(45) Date of Patent: May 10, 2005

(54) MANUFACTURING METHOD OF ELECTROLUMINESCENCE DISPLAY APPARATUS

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/185,546

(22) Filed: Jun. 28, 2002

(65) Prior Publication Data

US 2003/0020181 A1 Jan. 30, 2003

(30) Foreign Application Priority Data

Jun. 29, 2001  (JP) ........................................ 2001-198926

(51) Int. Cl.⁷ .............................................. H01L 21/00
(52) U.S. Cl. .......................... 438/29; 438/26; 313/512
(58) Field of Search ........................... 257/88, 100, 98; 438/34, 29, 26; 313/512

(56) References Cited

U.S. PATENT DOCUMENTS

| | | | |
|---|---|---|---|
| 4,640,583 A | 2/1987 | Hoshikawa et al. | |
| 5,085,605 A | 2/1992 | Itani et al. | |
| 5,239,228 A | 8/1993 | Taniguchi et al. | |
| 5,246,789 A | 9/1993 | Itani et al. | |
| 5,426,522 A | 6/1995 | Takahara et al. | |
| 5,568,297 A | 10/1996 | Tsubota et al. | |
| 5,632,663 A | 5/1997 | Ishihara et al. | |
| 5,717,476 A | 2/1998 | Kanezawa | |
| 5,788,551 A | 8/1998 | Dynka et al. | |
| 5,909,266 A | 6/1999 | Matsuo et al. | |
| 5,959,712 A | 9/1999 | Morii et al. | |
| 6,191,841 B1 * | 2/2001 | Ootaguro et al. | 349/190 |
| 6,222,603 B1 | 4/2001 | Sakai et al. | |
| 6,268,071 B1 | 7/2001 | Yasukawa et al. | |
| 6,284,342 B1 | 9/2001 | Ebisawa et al. | |
| 6,612,888 B1 | 9/2003 | Pai et al. | |
| 6,624,570 B1 * | 9/2003 | Nishio et al. | 313/506 |
| 2002/0000560 A1 | 1/2002 | Ishii et al. | |

FOREIGN PATENT DOCUMENTS

| | | |
|---|---|---|
| EP | 0 415 372 | 3/1991 |
| EP | 0 969 700 | 1/2000 |
| JP | 4-199129 | 7/1992 |
| JP | 6-102498 | 4/1994 |
| JP | 7-64101 | 3/1995 |
| JP | 11-224773 | 8/1999 |
| JP | 2000-3783 | 1/2000 |
| JP | 2000-47229 | 2/2000 |
| JP | 2000-173766 | 6/2000 |
| JP | 2001-35654 | 2/2001 |
| JP | 2001-102167 | 4/2001 |
| JP | 2001-155855 | 6/2001 |
| KR | 1991-0005078 | 3/1991 |
| KR | 2001-0050684 | 6/2001 |

OTHER PUBLICATIONS

A copy of the excerpt English translation of the Japanese Patent Laid–Open Publication No. Hei 11–224773.
A copy of the excerpt English translation of the Japanese Patent Laid–Open Publication No. Hei 2001–155855.

(Continued)

Primary Examiner—Sara Crane
(74) Attorney, Agent, or Firm—Cantor Colburn LLP

(57) ABSTRACT

A supported glass substrate is placed with an element-forming surface thereof facing downward. A mother sealing substrate is placed on a support made of a quartz glass or the like. An ultraviolet-curing sealing resin is applied on the mother sealing substrate. After the glass substrate is aligned with the mother sealing substrate, the glass substrate is pressed toward the sealing substrate. The sealing resin is irradiated with ultraviolet light transmitted through the sealing substrate.

1 Claim, 6 Drawing Sheets

OTHER PUBLICATIONS

Office Action for Chinese Patent Application No. 02125167.3 dated Jun. 25, 2004.

Office Action for Korean Patent Application No. 10-2002-0036901 dated Jul. 22, 2004.

Office Action for Korean Patent Application No. 10-2002-0036798 dated Mar. 2, 2004.

Office Action for Korean Patent Application No. 10-2002-0037534 dated Jul. 26, 2004.

* cited by examiner

MANUFACTURING METHOD OF ELECTROLUMINESCENCE DISPLAY APPARATUS

BACKGROUND OF THE INVENTION

1. Field of the Invention

The present invention relates to a method for manufacturing an electroluminescence display. More specifically, it relates to a method for manufacturing an electroluminescence display apparatus wherein a substrate onto which an electroluminescence element is formed is sealed using a sealing substrate.

2. Description of the Related Art

In recent years, display apparatuses employing electroluminescence (EL: Electroluminescence) elements have received widespread attention.

A typical EL element is configured by sequentially laminating, for example, an anode comprising a transparent electrode such as ITO (Indium Tin Oxide), a hole transporting layer, an emissive layer and a cathode on a transparent substrate. In such an EL element, holes injected from the anode and electrons injected from the cathode are recombined in the emissive layer so that organic molecules contained therein are excited and then excitons are generated. Subsequently, the emissive layer emits light in the deactivation process of the excitons and the light is emitted from the transparent anode to the outside through the transparent substrate.

A typical display apparatus using an EL element as described above has a sealing substrate to seal the transparent element substrate onto which the EL element is formed in order to prevent degradation of the characteristics of the EL element due to moisture in the EL element. More specifically, in such display apparatus, degradation in characteristics of the EL element due to moisture in the EL element is avoided by bonding an element surface of the transparent element substrate having the above-described element formed thereon with the sealing substrate made of, for example, metal. When these substrates are bonded, a sealing resin, for example, a resin in which are mixed bead-shaped glass fibers to create a spacer, is used to define a gap between the sealing substrate and the transparent element substrate onto which the EL element is formed. However, because the heat resistance of typical EL element materials is low, it is not possible to ensure that quality of an EL display apparatus will be maintained when a sealing resin requiring a high-temperature heat treatment is used to bond the transparent element substrate with the sealing substrate.

In order to resolve this problem, it can be conceived to adopt a method for applying a sealing resin cured with ultraviolet light between the transparent element substrate and the sealing substrate, and the sealing resin is irradiated with the ultraviolet light transmitted through the sealing substrate to bond the transparent element substrate and the sealing substrate. The use of the sealing resin cured with ultraviolet light or the like allows the transparent element substrate to be bonded with the sealing substrate without exposing the EL element to elevated temperatures. Accordingly, it becomes possible to maintain adequate quality for an EL display apparatus.

Here it should be noted that because the sealing resin is irradiated with light emitted from a UV lamp on the transparent element substrate side of the device, not just the sealing resin, but also the EL element and other components are exposed to the ultraviolet light during the curing process. Therefore, although degradation in EL element characteristics resulting from exposure to elevated temperatures can be prevented, there remains a possibility that characteristics can be degraded due to short-time exposure to the ultraviolet irradiation.

SUMMARY OF THE INVENTION

The present invention, which was conceived in view of the situation described above, therefore aims to appropriately seal a substrate onto which an EL element is formed while maintaining adequate quality of a display apparatus.

In order to achieve the above object, the present invention provide a method for manufacturing an electroluminescence display apparatus comprising steps of affixing an element substrate on which an electroluminescence element is formed and a sealing substrate fixedly placed so as to oppose to an element-forming surface of said element substrate via a sealing resin between the two substrates, pressing said element substrate toward said sealing substrate, and curing said sealing resin so as to bond said element substrate and said sealing substrate.

In another aspect of the present invention, said sealing resin may be made of a light-curing resin such as an ultraviolet-curing resin.

In another aspect of the present invention, said sealing substrate made of a light-transmissive material which transmits light for curing said sealing resin such that the sealing resin is irradiated with the light.

In another aspect of the present invention, said sealing substrate made of a light-transmissive material is placed and fixed on a support for the sealing substrate which is also light transmissive. Light for curing the sealing resin is then transmitted through said sealing substrate and said support for the sealing substrate to irradiate said sealing resin.

In another aspect of the present invention, light for curing the sealing resin is emitted from a light source, placed below said support for the sealing substrate, and transmitted through said sealing substrate and said support for the sealing substrate to irradiate said sealing resin.

According to these aspects, even in a case where, for example, the sealing resin is irradiated with the light transmitted through the sealing substrate for curing, it is possible to ensure that the light required to cure the sealing resin is not blocked by a moving system because the sealing substrate side is fixed at the time of bonding. If the sealing substrate side is movable, it will be necessary to install the moving system on the sealing substrate side causing blockage of the irradiation with the lights to thereby facilitate effective irradiation of the sealing resin with light for curing. Further, because the structure is not as complex as that which would be required if the sealing substrate were movable. As a result, it becomes possible to reduce manufacturing costs involved with the sealing process.

According to another aspect of the present invention, said element substrate is affixed with said sealing substrate after said sealing resin is applied on a bonding surface of said sealing substrate at a location corresponding to a location surrounding an element-forming region of said element substrate.

Thus, the sealing substrate, applied the sealing resin at the location surrounding the element-forming surface and fixedly placed, is affixed with the element substrate by pressing the element substrate toward the sealing substrate. When a light-curing resin is used as the sealing resin as described above, it is possible to affix the two substrates and then bond them by curing the sealing resin placed between them while employing a simple structure.

In another aspect of the present invention, said sealing substrate, placed with the bonding surface thereof facing upwards when said sealing resin is applied, is installed on said sealing substrate support in such a manner that the bonding surface continues to face upwards after the completion of applying of said sealing resin.

Because at least the bonding surface applied with the sealing resin is fixedly placed facing upwards as described above, it is possible to properly bond and seal the sealing substrate and the element substrate while the sealing resin applied in paste form is reliably prevented from dripping, falling, or otherwise improperly moving away from the applied position due to gravity. Further, by transiting to the subsequent affixing process in a state in which the surface coated with the sealing resin continues to face upwards, it becomes unnecessary to employ a process of turning over or flipping the sealing substrate or the like. This further contributes to a reduction in manufacturing costs.

Further, in another aspect of the present invention, a depression is preformed on said bonding surface side of said sealing substrate, and a desiccant is applied in said depression. Because the bonding surface faces upward throughout this stage of manufacture, it is still possible to proceed to the bonding process without changing the work surface, even with the desiccant thus applied on the bonding surface side. This contributes to still further reduction in manufacturing costs. Further, it is also possible to prevent dropping or falling of the desiccant due to flipping of the work surface before the desiccant coated in a pasted form is cured and adhered on the sealing substrate side.

Moreover, in another aspect of the present invention, an element layer to be formed by evaporation of said electroluminescence element provided on said element substrate is formed in a state that said element-forming surface faces downwards.

According to this technique, a material is evaporated from an evaporation source provided in a lower location of the substrate and then vapors of the material climbing up are adhered onto the undersurface of the substrate placed above the material. Thus, formation of the element layer by evaporation can be completed effectively.

In another aspect of the present invention, an element layer of said electroluminescence element is formed on said element substrate by evaporation in a state wherein said element-forming surface faces downwards, and then said element substrate placed with said element-forming surface facing downwards is pressed to said sealing substrate immovably placed at the lower location so as to affix the substrates by the sealing resin located between them.

Thus, on the element substrate side, when the evaporation method is employed to form the element layer, the element layer is formed in a state wherein the element-forming surface faces downwards. After this, the element substrate proceeds to the bonding process with the element-forming surface still facing downward. This allows the element substrate to be efficiently placed on the sealing substrate, in turn fixedly placed below the element substrate, without changing the downward-facing work surface.

In another aspect of the present invention, at the affixing between said element substrate and said sealing substrate said sealing substrate is fixedly placed in such a manner that the surface to be bonded with said element substrate faces upward said element substrate is movably placed with the element-forming surface facing downward, and then said element substrate is pressed toward said sealing substrate.

Because the sealing substrate is fixed and the element substrate placed on the upper side is movable, this structure realizes advantage such that, when a light-curing resin is used as the sealing resin and light for curing the resin is transmitted through the sealing substrate to expose the sealing resin, it is not necessary to provide a mechanism for moving the sealing substrate side such that light will be transmitted. As a result, the light irradiation is not blocked. Further, the element substrate can be moved by a simple mechanism because a light-irradiation mechanism is not required on the element substrate side. Still further, because the bonding surface of the sealing substrate continues to face upwards after the sealing resin is applied thereon as described above at the time of bonding with the element substrate, simple structure, precise bonding, and reduced manufacturing costs can be obtained.

In another aspect of the present invention, said element substrate movably placed is aligned with said sealing substrate fixedly placed by adjusting a location of said element substrate with reference to said sealing substrate prior to said bonding.

When the element substrate side is moved to align with the sealing substrate, it becomes possible to precisely and reliably perform the alignment, to improve the sealing accuracy, and to contribute to improvement of the final quality of a display apparatus because it is unnecessary to move the sealing substrate coated with the sealing resin as described above.

In another aspect of the present invention, a driver circuit to drive said electroluminescence element is placed on a peripheral area of an electroluminescence element forming region of said element substrate, and a transistor, used by said driver circuit, onto which a lightshielding gate electrode is formed at a location close to said sealing substrate than an active layer.

In some instances, such a driver circuit may be placed in the vicinity of the region applied the sealing resin or placed in such a manner as to overlay the region applied the sealing resin, such that the driver circuit part is exposed to the light from the sealing substrate side when the light irradiated in order to cure the sealing resin. Even in this case, however, because the lightshielding gate electrode is placed on the sealing substrate side as a transistor for the driver circuit at a location closer to said sealing substrate in comparison with an active layer, it is possible to prevent that characteristics of the transistor is adversary affected by exposing, for example, the channel region in the active layer on the location opposing to the gate electrode to light.

In another aspect of the present invention, on said electroluminescence element formed on said element substrate, a lightshielding layer is formed at a location closer to said sealing substrate than a position of an emissive element layer in such a manner that said emissive element layer is shielded from exposure to light emitted from said sealing substrate side for curing said sealing resin. In addition, the lightshielding layer may be comprise, for example, the electrode of the electroluminescence element.

Because the lightproof layer comprising, for example, the electrode is placed on the sealing substrate side as described above, the emissive element layer of the electroluminescence element or the like is protected from exposure to the light, even when the light for curing the sealing resin is emitted from the sealing substrate side. As a result, an emissive element layer susceptible to degradation due to exposure to intense light, namely the electroluminescence element, can be protected.

In another aspect of the present invention provide a method for manufacturing an electroluminescence display apparatus comprising steps of affixing a mother element substrate comprising a plurality of element substrate regions on which are formed electroluminescence elements, with a sealing substrate applied a sealing resin in such a manner that each display region in said plurality of element substrate regions is surrounded with said sealing resin, pressing said mother element substrate and sealing substrate affixed each other via said sealing resin, and said sealing resin is irradiated with light transmitted from said sealing substrate side for curing so as to bond each of said element substrate forming regions of said mother element substrate with corresponding regions of said sealing substrate.

The electroluminescence elements and the transistors for driving them formed on the mother element substrate side may sometimes block the light. Therefore, it is impossible to irradiate the entire region of the sealing resin placed between the substrates with the light from the mother element substrate side, even when a light-transmissive glass substrate is used as the mother element substrate. However, in many cases, it is not necessary to form such elements on the sealing substrate side. When the mother element substrate is bonded with the sealing substrate, the sealing resin can be cured over a widespread area uniformly and simultaneously by exposing the sealing resin to the light emitted from the sealing substrate side in order to cure the sealing resin located between substrates.

In another aspect of the present invention, said mother element substrate, movably placed with element-forming surface thereof facing downward, is pressed toward said sealing substrate, fixedly placed in such a manner that the surface to be bonded with said mother element substrate faces upward at the time of affixing.

In another aspect of the present invention, said mother element substrate movably placed is aligned with said sealing substrate fixedly placed by adjusting the location of said mother element substrate with reference to said sealing substrate prior to said bonding.

In another aspect of the present invention, light from said electroluminescence elements is emitted toward the outside from the element substrate side located on the other side of said sealing substrate.

When mother element substrate is bonded with the sealing substrate as described above, it becomes possible to execute sealing procedure using a simple mechanism by fixedly placing the sealing substrate in such a manner that the surface applied with the sealing resin faces upward, by providing the moving system to the mother element substrate placed above the sealing substrate at the time of bonding or at the time of alignment.

DESCRIPTION OF THE PREFERRED EMBODIMENT

Figure 1:
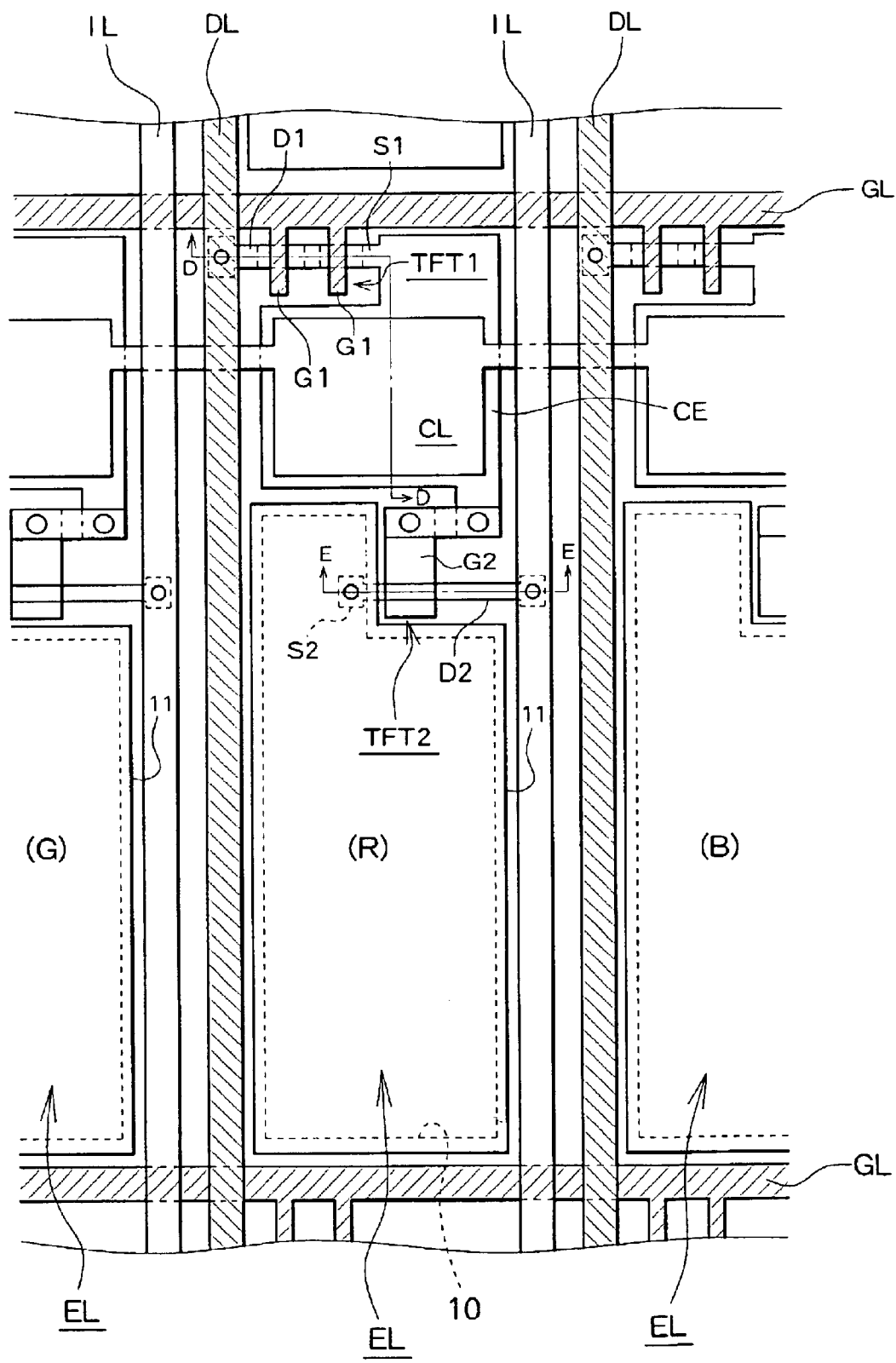
FIG. 1 is a plan view of an active matrix type EL display apparatus according to an embodiment of the present invention.

A method for manufacturing an electroluminescence display according to the present invention will be described below, using an example method for manufacturing an active matrix type electroluminescence display and while referring to the drawings.

FIG. 1 is a plan view of an EL element (which is an organic EL element in this embodiment and is indicated as "EL" in FIG. 1) and its peripheral section, of an EL display apparatus to be manufactured according to the present embodiment. Referring to FIG. 1, the EL display apparatus comprises a display pixel formed by the EL element, and a thin film transistor (TFT) which is an active element provided for each corresponding display dot.

More specifically, as shown in FIG. 1, gate signal lines GL and drain signal lines (data signal lines) DL are arranged in a matrix as signal lines for performing drive control of the EL element. An EL element (display pixel) is provided corresponding to each intersection of these signal lines. In the EL display apparatus shown in FIG. 1, each display pixel corresponds to any one of the primary colors R, G and B, to thereby enable color image display.

Additional elements are also provided so as to perform drive control of each of the EL elements separately. First, near the above-described intersection of the signal lines, a thin film transistor (TFT1), which is connected with the gate signal line GL and functions as a switching element to be turned ON due to the activity of the gate signal line GL, is formed. A source S1 of this TFT1 serves also as a capacitor electrode CE and a storage capacitor is formed between the capacitor electrode CE and a capacitor line CL made of a refractory metal such as chromium (Cr) and molybdenum (Mo). When the TFT1 is turned ON, an electrical charge in accordance with the voltage of a data signal supplied from the data line DL is accumulated in the storage capacitor.

The capacitor electrode CE is connected to a gate G2 of a thin film transistor (TFT2) which drives the EL element. Further, a source S2 of the TFT2 is connected with a transparent electrode 11 which is an anode of the EL element, while a drain D2 of the TFT2 is connected with a drive power source line IL which is a current source for supplying an electrical current to the EL element. With this structure, a voltage in accordance with the electrical charge stored in the storage capacitor is applied from the capacitor electrode CE to the gate G2, such that a current in accordance with the applied voltage is supplied from the drive power source line IL to the EL element.

Figure 2A:
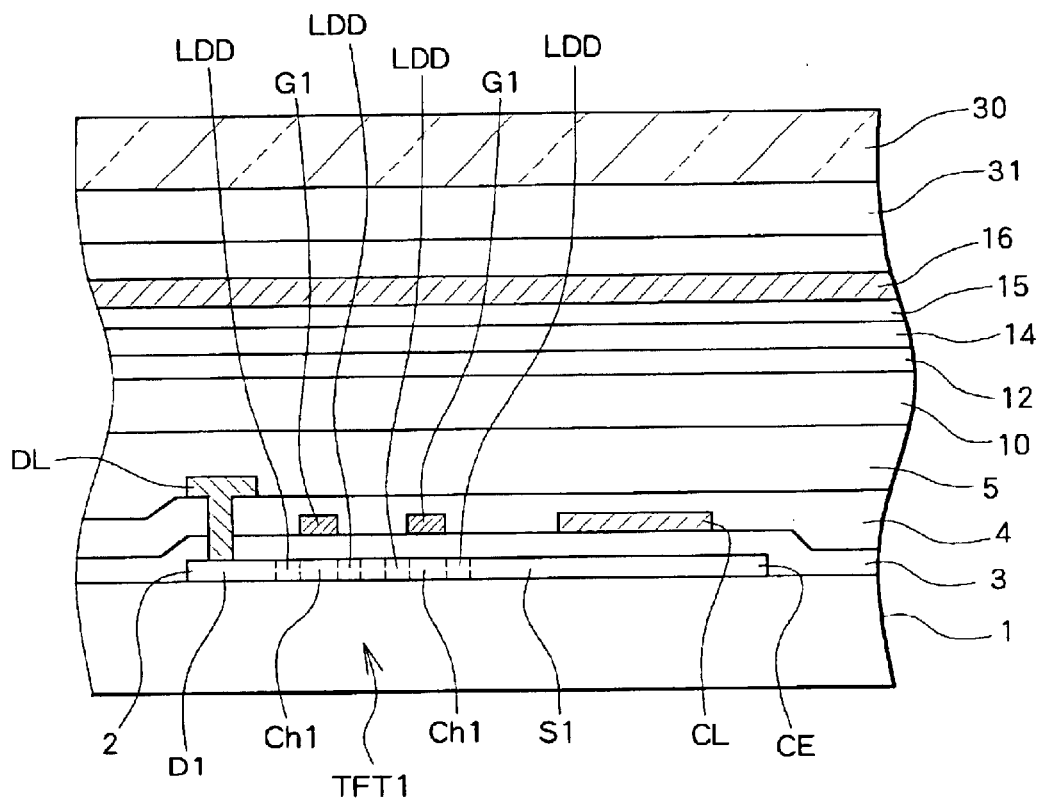
FIGS. 2A and 2B are views along line D—D and line E—E in FIG. 1, respectively.
Figure 2B:
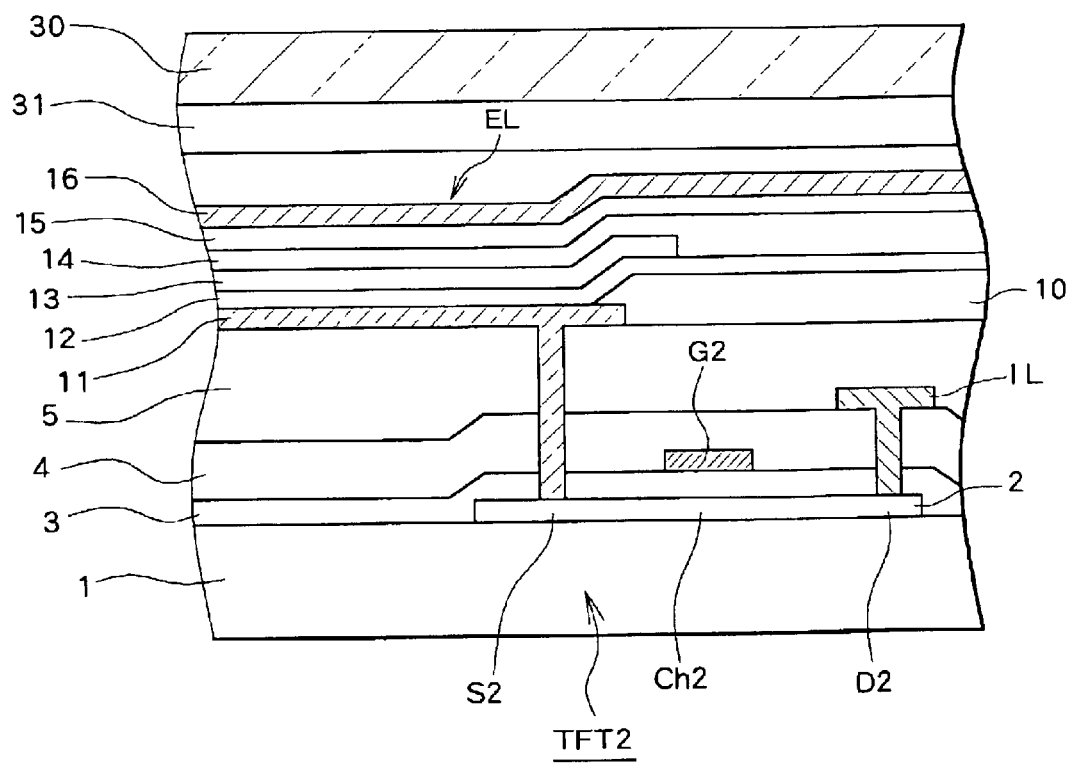

FIGS. 2A and 2B are cross sectional views taken along lines D—D and E—E of FIG. 1, respectively. As shown in FIGS. 2A and 2B, the above-described EL display apparatus is formed by sequentially forming a thin film transistor and an EL element on a glass substrate 1 in a laminated structure.

First, the TFT1 which serves as a switching transistor for performing charging control of the storage capacitor is formed in a manner shown in FIG. 2A. Specifically, on the glass substrate 1, a poly-silicon layer 2 is formed. In this poly-silicon layer 2, the above-described source S1 and the drain D1 as well as channels Ch1 are formed, while LDDs (Lightly Doped Drains) are further provided on both outer sides of the channels Ch1. The poly-silicon layer 2 also serves as a storage capacitor electrode CE. On the poly-silicon layer 2 and the storage capacitor electrode CE, a gate insulating film 3, the above-described gate signal line GL made of a refractory metal such as Cr and Mo and a gate electrode G1 which is integral with the gate signal line GL, and a storage capacitor electrode line CL are formed. Further, over these layers, an interlayer insulating film 4 formed by accumulating a silicon oxide film and silicon nitride film, in this order, in a laminate structure is provided. This interlayer insulating film 4 has an opening at a position corresponding to the drain D1. By filling this opening with a conductive material such as aluminum, the drain D1 comes into electrical contact with the drain signal line DL. Further, on these drain signal line DL and the interlayer insulating film 4, a planarization insulating film 5 made of, for example, an organic resin, is formed for surface planarization.

On the other hand, the TFT2 for driving the EL element is formed in a manner as shown in FIG. 2B. Specifically, on the glass substrate 1, a poly-silicon layer 2 which is equal to that shown in FIG. 2A is formed. In this poly-silicon layer 2, a channel Ch2, a source S2, and a drain D2 of the TFT2 are formed. On this poly-silicon layer 2, a gate insulating film 3 which is equal to that shown in FIG. 2A is formed, and on the portion of the gate insulating film 3 which is located above the channel Ch2, a gate G2 made of a refractory metal such as chromium (Cr) and molybdenum (Mo) is provided. Over the gate G2 and the gate insulating film 3, an interlayer insulating film 4 and a planarization insulating film 5 which are equal to those shown in FIG. 2A are sequentially formed in a laminate structure. The interlayer insulating film 4 has an opening at a position corresponding to the drain D2, and by filling this opening with an conductive material such as aluminum, the drain D2 comes in electrical contact with the drive power source line IL. Also, a contact hole is formed through portions of the interlayer insulating film 4 and the planarization insulating film 5 which correspond to the source S2. Then, ITO (Indium Tin Oxide) is formed so as to fill this contact hole, so that the source S2 comes in electrical contact with an transparent electrode 11 made of ITO or the like. The transparent electrode 11 constitutes an anode of the EL element. It should be noted that the source S2 is not necessarily brought in direct contact with the ITO, and the source S2 and the ITO may be connected in the following manner, for example. That is, a contact hole is first formed in the interlayer insulating film 4 and the gate insulating film 3, and the hole is filled with a conductive material such as aluminum simultaneously with the formation of the contact (the drain electrode) between the drain D2 and the power source line IL. Then, another contact hole is formed at a corresponding portion of the planarization insulating film 5, which is subsequently formed, and ITO is formed so as to fill this contact hole.

As an example, the EL element may comprise the following layers sequentially accumulated in a laminate structure:

a) a transparent electrode 11;
 b) a hole transporting layer 12 made of NBP;
 c) an emissive layer 13 for red (R) obtained by doping a dopant of red color (DCJTB) into a host material (Alq3), for green (G) obtained by doping a dopant of green color (Coumarin 6) into a host material (Alq3), or for blue (B) obtained by doping a dopant of blue color (Perylen) into a host material (BAlq);
 d) an electron transporting layer 14 made of Alq3;
 e) an electron injecting layer 15 made of lithium fluoride (LiF); and
 f) an electrode (cathode) 16 made of aluminum (Al).

The abbreviations used in the above description refer to the following materials:

"NBP" refers to N,N'-di((naphthalene-1-yl)-N,N'-diphenylbenzidine);

"Alq3" refers to tris(8-hydroxyquinolinato)aluminum;

"DCJTB" refers to (2-(1,1-dimethylethyl)-6-(2-(2,3,6,7-tetrahydro-1,1,7,7-tetramethyl-1H,5H-benzo[ij]quinolizin-9-yl)ethenyl)-4H-pyran-4-ylidene)propanedinitrile;

"Coumarin 6" refers to "3-(2-benzothiazolyl)-7-(diethylamino)coumarin; and

"BAlq" refers to (1,1'-bisphenyl-4-Olato)bis(2-methyl-8-quinolinplate-N1,08)Aluminum.

The hole transporting layer 12, the electron transporting layer 14, the electron injecting layer 15 and the electrode 16 are also formed in the regions shown in FIG. 2A as common layers. However, the emissive layer 13, which is formed in an individual island shape for each pixel so as to correspond to the transparent electrode 11, is not shown in FIG. 2A. It should be noted that, as shown in FIGS. 2A and 2B, an insulating film 10 is formed on the planarization insulating film 5.

Further, in order to keep the EL element formed on the glass substrate 1 from contacting with water, the EL element-forming surface (element surface) of the glass substrate 1 is sealed by a sealing substrate 30 made of glass as well as a desiccant 31 comprising, for example, a calcium oxide (CaOx), a barium oxide (BaOx) and so on is included between the sealing substrate 30 and a cathode 16.

Figure 3:
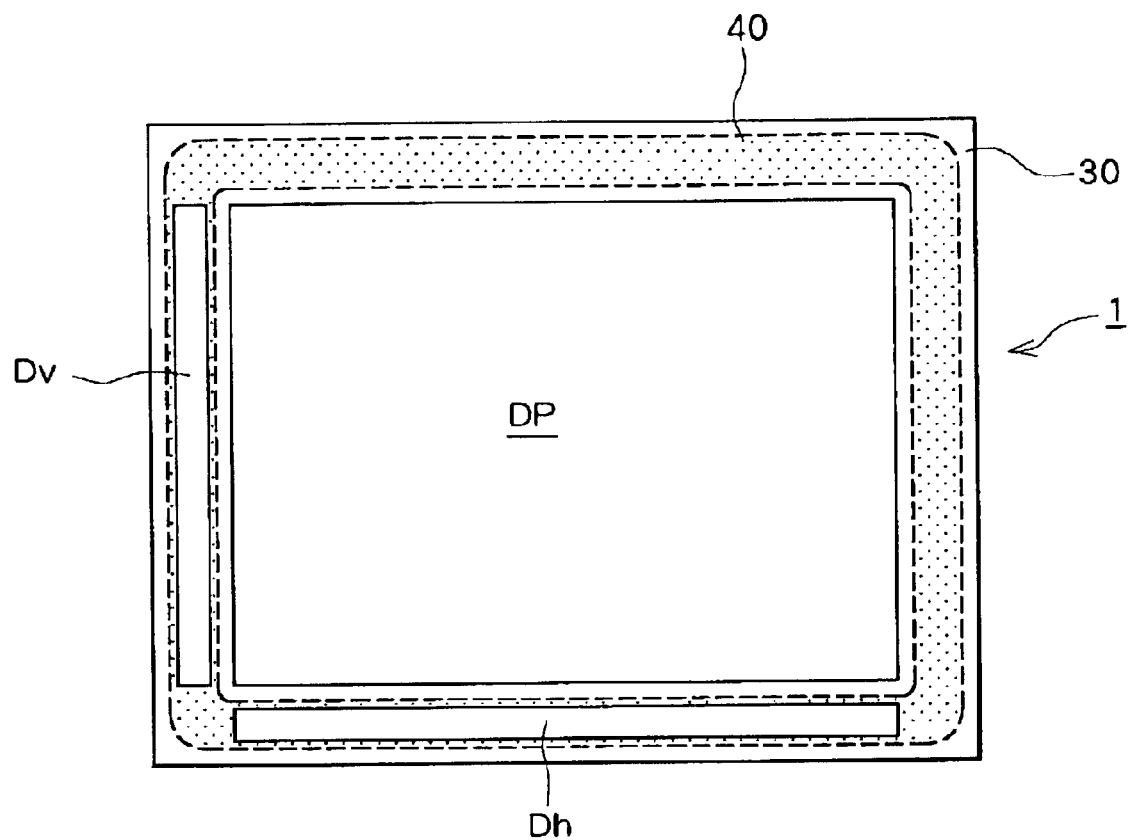
FIG. 3 is a conceptual illustration of the EL display apparatus according to the embodiment of the present invention as viewed from above.

FIG. 3 is a conceptual illustration showing the glass substrate 1 from the upper surface thereof (the element-forming surface, the side sealed by the sealing substrate 30). On the glass substrate 1, a display region DP having the above-mentioned EL element and the TFT, and drivers Dv and Dh to drive the TFT in the display region DP are formed as shown in FIG. 3.

The display region DP is sealed by the sealing substrate 30 in order to keep the EL element formed within the display region from contacting with water. To be more specific, the glass substrate 1 and the sealing substrate 30 are bonded with each other by a sealing resin 40 coated in such a manner as to surround the display region DP. This sealing resin 40 may contain, for example, glass fibers (not shown in the figure) in the shape of a bead to define a gap between the glass substrate 1 and the sealing substrate 30. The sealing substrate 30 has a depression formed on the region corresponding to the display region DP where the desiccant 31 is filled.

Figure 4:
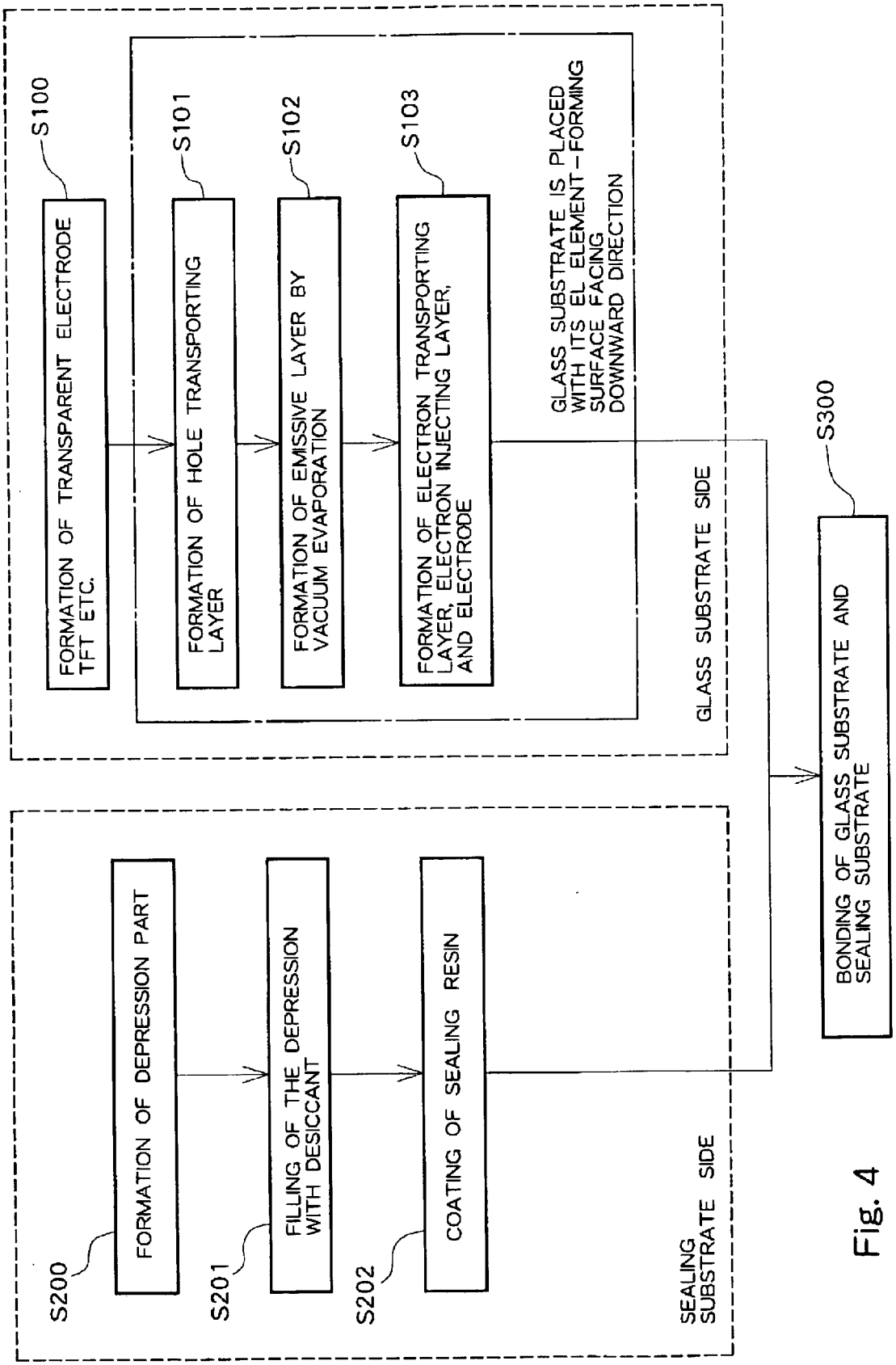
FIG. 4 is a flowchart showing process steps of a method for manufacturing an EL display apparatus in accordance with the embodiment of the present invention.
Figure 5:
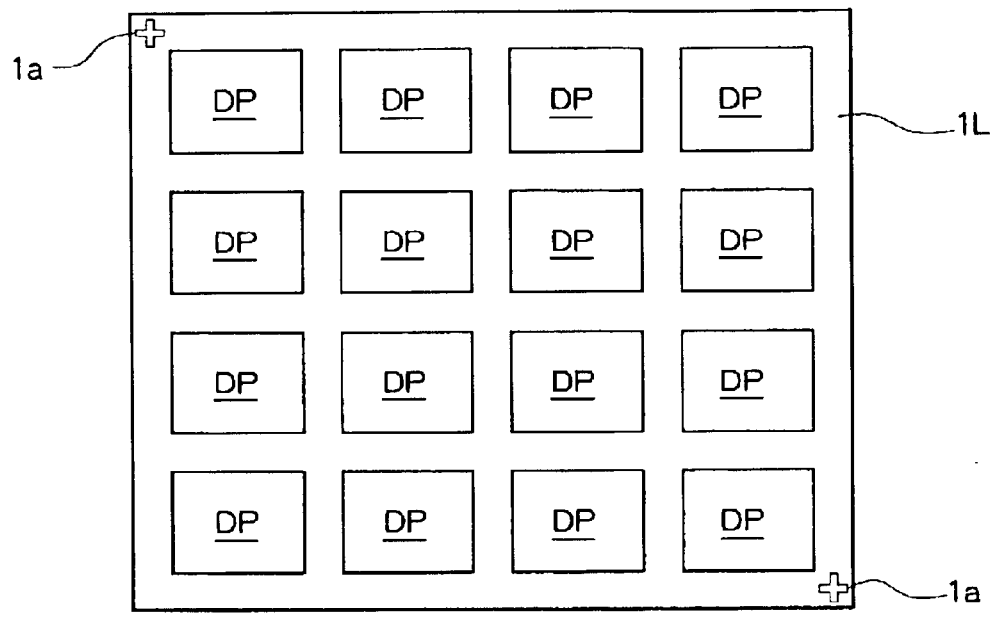
FIG. 5 is a conceptual illustration of a state of a glass substrate in accordance with the embodiment of the present invention.

Referring to FIG. 4, a method for manufacturing an EL display apparatus in accordance with this embodiment will be explained. FIG. 4 shows process steps for manufacturing an EL display apparatus in accordance with the embodiment. In this embodiment, plural sets of the display regions DP and the drivers Dv and Dh as shown in FIG. 3 are formed on a single sheet of a large glass substrate in order to produce a plurality of EL display apparatuses at a time. As shown in FIG. 5 in detail, sixteen sheets of the display region DP's and sixteen sets of drivers Dv and Dh (not illustrated) are formed on a glass substrate 1L in this embodiment.

Referring again to FIG. 4, the TFTs, the transparent electrodes 11, and so on are formed on the glass substrate 1L in the manner shown in FIGS. 2A and 2B (S100). At the same time, the drivers Dv and Dh are formed in regions surrounding the display region DP's on the glass substrate 1L.

Next, the hole transporting layer 12 of the EL element is formed by vacuum evaporation (S101). The hole transporting layer 12 does not cover forming regions of the drivers Dv and Dh and not-illustrated terminals located outside of the display regions DP of FIG. 3 and terminals (also not illustrated), but only covers the display regions DP even in a case where the hole transporting layer 12 is formed in common to all the pixels as shown in FIGS. 2A and 2B. Therefore, at least when a plurality of panels are produced from a single-sheet substrate as shown in FIG. 5, a mask having openings only for the display regions DP is used for forming the hole transporting layer 12. In this case, the mask is preset in a vacuum chamber for forming the hole transporting layer. The glass substrate 1L, onto which the planarization insulating film 10 is formed by overlaying the edge of the transparent electrode 11, is inserted into the vacuum chamber from above with its upper surface facing down and aligned with the mask laid beneath the substrate. After completion of alignment, a material of the hole transporting layer is evaporated from an evaporation source provided under the mask so that the hole transporting layer is formed on each of the display regions.

Next, the emissive layer 13 is formed by vacuum evaporation on the glass substrate 1L having the hole transporting layer 12 formed as described above without exposing the glass substrate 1L to air (S102). At the time of forming the emissive layer 13, the glass substrate 1L is inserted into a vacuum chamber, in which a mask having an opening corresponding to the transparent electrode 11 formed on the glass substrate 1L is preset, from above the mask. Then, the glass substrate 1L placed with its element-forming surface facing downward is aligned with the mask. After completion of alignment, a material of the emissive layer 13 is heated and evaporated through the opening of the mask so that the emissive layer 13 is formed on the glass substrate 1L. Referring to the formation of the emissive layer 13 by evaporation in detail, for primary colors of red (R), green (G), and blue (B), respective masks and vacuum chambers are prepared and used for forming the emissive layer 13.

The glass substrate 1L having the emissive layer 13 thus formed thereon is removed from the vacuum chambers used for forming the emissive layer. Successively, the electron transporting layer 14, the electron injecting layer 15, and the cathode 16 are formed by the same type of vacuum evaporation, also in a state in which the surface, where the emissive layer 13 is formed, faces downward vertically (S103). For the electron transporting layer 14, there may be cases where at this point the electron transporting layer 14 is formed in individual patterns corresponding to each pixel using a similar mask just as with the emissive layer 13 depending on characteristics of organic materials to be used. On the other hand, the electron injecting layer 15 and the cathode 16 are formed, as in the case of the hole transporting layer 12 described above, in a pattern overlaying all of the display regions DP without covering the surrounding regions where the drivers Dv and Dh are located.

Figure 6:
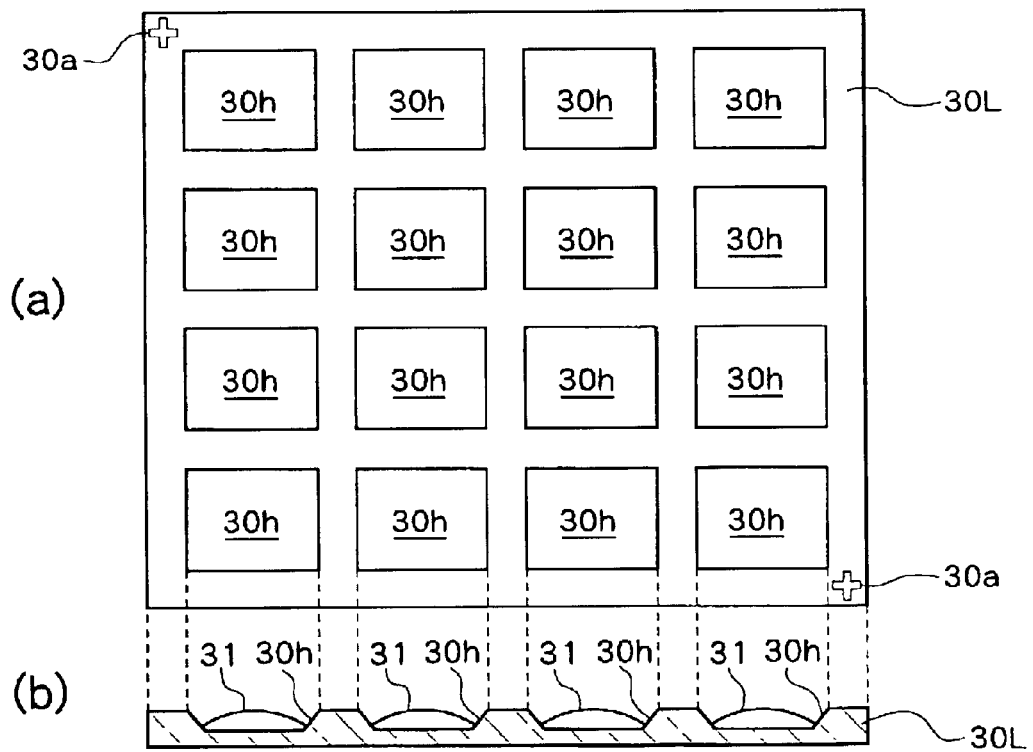
FIG. 6 is another conceptual illustration of a state of a sealing substrate in accordance with the embodiment of the present invention.

Referring to the sealing substrate 30, a depression to be filled with the desiccant 31 is formed thereon (S200). More precisely, in this example sixteen sets of the sealing substrates 30 are simultaneously formed on the mother sealing substrate 30L to be bonded with the glass substrate 1L as shown in FIG. 6. Therefore, sixteen parts of depressions 30h are formed on the mother sealing substrate 30L. The depressions 30h are formed on the mother sealing substrate 30L in the regions corresponding to the display regions DP of the glass substrate 1L.

After forming the depressions 30h on the mother sealing substrate 30L, the desiccant 31 is applied in the depressions 30h as shown in FIG. 6(b) (S201 shown in FIG. 4). After the completion of the applying and calcining of the desiccant 31, the sealing resin 40 is applied around each of the above-mentioned depressions 30h on the mother sealing substrate 30L (S202 shown in FIG. 4). In order to define the gap between the glass substrate 1L and the mother sealing substrate 30L, the sealing resin 40 contains glass fibers, as described above.

When the processes for forming the cathode 16 on the organic layer of the EL element formed over glass substrate 1L and for applying the sealing resin 40 on the mother sealing substrate 30L are completed, the glass substrate 1L is affixed to the mother sealing substrate 30L (S300 shown in FIG. 4).

Because organic EL elements which have already developed do not have high heat resistance, as described above, there is a possibility of degradation of the EL element when a thermosetting resin is used as the sealing resin. In order to prevent the possibility, in the present invention, an epoxy resin, for example, a resin capable of cationic polymerization, which is cured by exposure to ultraviolet light is used as the sealing resin 40. Thus, by curing the sealing resin 40 by exposing it to ultraviolet light, the glass substrate 1L can be bonded with the mother sealing substrate 30L while degradation in characteristics caused by exposing the EL element to elevated temperatures is prevented.

However, application of ultraviolet light to the sealing resin 40 through the glass substrate 1L creates, as noted above, a risk that other components whose characteristics may be prone to degradation when exposed to ultraviolet light (specifically, for example, an organic layer using organic materials of which glass-transition temperature Tg is low) such as the hole transporting layer 12, the emissive layer 13, the electron transporting layer 14, the electron injecting layer 15, and so on among EL elements.

Therefore, in this embodiment, a substrate allowing ultraviolet light to transmit is used as the mother sealing substrate 30L and the sealing resin 40 is irradiated with the ultraviolet light transmitted through the mother sealing substrate 30L. By thus applying ultraviolet light from the mother sealing substrate 30L side, the cathode 16 shown in FIG. 1 protects the components whose characteristics are prone to degradation when exposed to ultraviolet light, such as the above-noted hole transporting layer 12, the emissive layer 13, the electron transporting layer 14, the electron injecting layer 15, and so on among EL elements, from exposure to the ultraviolet light. In this embodiment, glass is used as the mother sealing substrate 30L allowing the ultraviolet light to transmitted.

Further, in this embodiment, transistors having top gate structure are used as the transistors which form the drivers Dv and Dh shown in FIG. 3 and materials opaque to ultraviolet light are employed as gate materials of the transistors. Regarding the TFT in the pixel part shown in FIGS. 1, 2A and 2B, because it is usually formed in almost the same process and at the same time as the transistors of the drivers Dv and Dh, the top gate structure is also applied to the TFT.

There is a possibility that the characteristics of transistors using polycrystalline silicon or the like as an active layer will vary when channel regions of the transistors are irradiated with ultraviolet light. It is inevitable that the region, in particular, where the drivers Dv and Dh are formed thereon will be exposed to the ultraviolet light used for curing the sealing resin because the region where the drivers Dv and Dh are formed overlaps the region where the sealing resin is coated. If the drivers Dv and Dh are formed on regions where the sealing resin is not applied in addition to shielding the regions where the drivers Dv and Dh are formed thereon from ultraviolet irradiation, edge portions of ineffective regions which do not have the function of a display operation as the EL display apparatus will be increased. In addition to this, the number of manufacturing process steps will be increased because a mask for shielding the drivers Dv and Dh from ultraviolet irradiation is used at the time of the ultraviolet irradiation.

In contrast to the transistors described above, here the transistors in the drivers Dv and Dh are formed as top gate transistors. Accordingly, because the gate protects the channel region from exposure to ultraviolet irradiation, it becomes possible to prevent change in the characteristics of the transistors due to direct irradiation with ultraviolet light to the channel region.

Further, in this embodiment, the surface of the glass substrate 1L on which the surface where the EL elements are formed and which faces downward and is affixed and bonded to the surface of the mother sealing substrate 30L where the desiccant 31 is applied and which faces upward. More specifically, all of the emissive layer 13, the electron transporting layer 14, the electron injecting layer 15, and the metal electrode 16 are formed on the hole transporting layer using organic materials by vacuum evaporation on the glass substrate 1L in the processes preceding the affixing process, as shown in FIG. 4. In the film forming process according to the vacuum evaporation, the glass substrate 1L is placed in such a manner that the element-forming surface thereof faces down. On the other hand, on the mother sealing substrate 30L, the desiccant 31 in a paste form is applied and calcined, and the seal resin 40 is applied and maintains its paste form. After that, the mother sealing substrate 30L advances to the subsequent sealing process. Therefore, the mother sealing substrate 30L is processed in a state that the surface wherein the desiccant 31 and the sealing resin 40 are applied faces upward in order to avoid falling off of the desiccant 31 and the sealing resin 40 before curing. According to this embodiment, the glass substrate 1L placed with its element-forming surface facing downward is affixed with the mother sealing substrate 30L placed with its surface applied the sealing resin 40 facing up. Thus, neither substrate requires flipping before proceeding to the affixing process. In other words, both substrates can easily advance to the affixing process.

Figure 7:
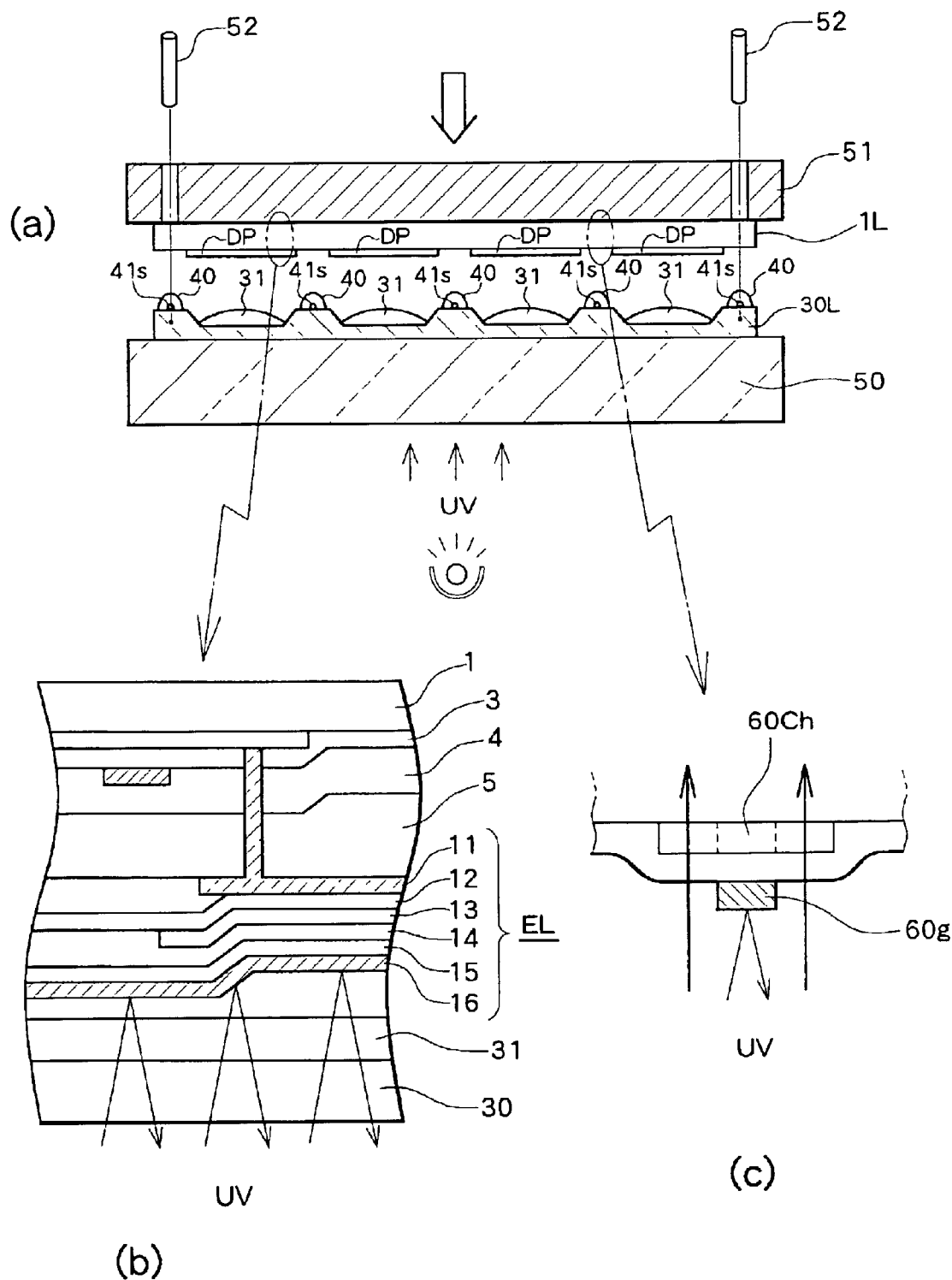
FIG. 7 is a sectional schematic showing states of a bonding process for bonding the glass substrate with the sealing substrate in the manufacturing method according to the embodiment of the present invention.

When the glass substrate 1L is affixed with the mother sealing substrate 30L, pressure is applied in order to securely bond these substrates. In the present embodiment, the pressure is applied as shown in FIG. 7, by a pressing system (not illustrated), to the glass substrate 1L from its upper surface (where the EL elements are not formed) toward the mother sealing substrate 30L placed on a transparent support 50 which allows the ultraviolet light to transmit. This creates a necessity for installing a UV lamp on the support 50 side because ultraviolet light is irradiated from the support 50 side through the mother sealing substrate 30L. The mother sealing substrate 30L, however, need not be provided with a pressing system because of the pressing system installed on the glass substrate 1L side. Thus, the support 50 need only hold the mother sealing substrate 30L and transmit the light emitted from the UV lamp. This allows for simplification of the mechanism on the side of the support 50. Further, the bonding (sealing) process can be completed easily without developing additional constraints such that the ultraviolet light be blocked by components of the pressing system, because the pressure is not applied from the support side. The alignment position at the time of affixing is adjusted on the glass substrate 1L by moving a support 51 which holds the glass substrate 1L. Therefore, the mother sealing substrate 30L can be fixedly placed on the support 50. If it is intended that the mother sealing substrate 30L be movable, the mother sealing substrate 30L should be tightly held on the support 50 by absorption or the like. In order to absorb the mother sealing substrate 30L, it is necessary to bore holes for absorption in the support 50. Such openings of the holes are prone to cause scattering of UV light emitted from the lamp. The scattering can interfere with effective curing of the seal resin. However, the absorption and holding of the mother sealing substrate 30L are not necessary in this embodiment. Therefore, problems as described above do not arise.

Referring to FIG. 7, the bonding process of the glass substrate 1L and the mother sealing substrate 30L is described in detail below.

FIG. 7(a) shows that the mother sealing substrate 30L is placed on the support 50 made of, for example, quartz glass which allows ultraviolet light to transmit and above these the glass substrate 1L is held on the support 51 by, for example, vacuum suction. The glass substrate 1L is aligned with the mother sealing substrate 30L with reference to an alignment mark 1a such as a mark of FIG. 5 formed on the glass substrate 1L and an alignment mark 30a such as a mark of FIG. 6 formed on the mother sealing substrate 30L. That is, while positions of the alignment marks 1a and 30a are monitored by, for example, a CCD (Charge Coupled Device) camera 52 shown in FIG. 7(a), the support 51 is shifted to the location where the alignment mark 1a is matched to the alignment mark 30a so as to align the glass substrate 1L with the mother sealing substrate 30L.

After the glass substrate 1L and the mother sealing substrate 30L have been aligned, the glass substrate 1L is bonded with the mother sealing substrate 30L. To be more specific, the glass substrate 1L is lifted down toward the mother sealing substrate 30L so that the lower surface of the glass substrate 1L makes contact with the sealing resin 40 applied on the sealing positions of the mother sealing substrate 30L. After the contact is made, the glass substrate 1L is further pressed toward the mother sealing substrate 30L from the support 51 side until the gap between the glass substrate 1L and the mother sealing substrate 30L reaches the size defined by a glass fiber 40s contained in the sealing resin 40. Whether the specified gap size is obtained is determined based on, for example, determination as to whether or not the pressure applied to the glass substrate 1L by a pressing component reaches or exceeds a predetermined magnitude. Once the gap between the glass substrate 1L and the mother sealing substrate 30L reaches the specified size, the UV lamp installed in a lower place of the support 50 is turned on so that the sealing resin 40 is irradiated with ultraviolet light (indicated as UV in FIG. 7(a)) transmitted through the transparent support 50 and the mother sealing substrate 30L. As a result, the sealing resin 40 made of ultraviolet-curing resin is cured.

FIG. 7(b) shows the display region DP irradiated with the ultraviolet light emitted from the mother sealing substrate 30L side. The metal electrode (cathode) 16 covering the whole display region DP is formed at the top layer of the EL element in the display region DP. Because the cathode 16 made of aluminum or the like blocks the ultraviolet irradiation, the EL elements (particularly organic layers) and the transistors formed under the cathode 16 in the display region DP are protected from exposure to ultraviolet light. In FIG. 7(c), the transistors in the drivers Dv and Dh irradiated with the ultraviolet light are shown. In contrast to the display region DP, the lightproof cathode 16 is not formed at an upper layer in the drivers Dv and Dh, as shown in FIG. 7(c). The transistors, however, have the top gate structure. A gate electrode 60g protects the channel region 60c from ultraviolet irradiation (indicated by solid lines with an arrow in FIG. 7(c)).

According to the present embodiment as described above, following advantages are obtained:

(1) The sealing resin 40 is irradiated with ultraviolet light emitted from the mother sealing substrate 30L side for curing in order to bond the glass substrate 1L with the mother sealing substrate 30L. If the ultraviolet light is emitted from the glass substrate 1L side, the organic layers of the EL element in the display region DP will be irradiated with the ultraviolet light, raising the possibility of degradation in characteristics of the EL element. However, when the ultraviolet light is emitted from the mother sealing substrate 30L side, the cathode 16 protects the EL element from exposure to the ultraviolet light. This prevents degradation of the organic layers due to exposure to the ultraviolet light.

(2) Through the use of the transistors having the top gate structure as the transistors for the drivers Dv and Dh, the gate electrode protects the channel region of the transistors in the drivers Dv and Dh from exposure to the ultraviolet light without installation of any additional opaque components.

(3) Application of the pressure from the glass substrate 1L side at the time of bonding precludes constraints of pressing so as not to block the ultraviolet light. As a result, the bonding procedure is simplified. Further, when the glass substrate 1L is aligned with the mother sealing substrate 30L at the time of bonding, the glass substrate 1L side is shifted. This means that irradiation with the ultraviolet light emitted from the mother sealing substrate 30L side is not blocked by movements for shifting the mother sealing substrate 30L and for suctioning the mother sealing substrate 30L in order to tightly hold the mother sealing substrate 30L at shifting.

(4) The glass substrate 1L is placed with the EL element-forming surface thereof facing downward and the mother sealing substrate 30L is placed with the surface thereof applied with desiccant 31 and the sealing resin 40 facing upward direction when they are bonded. This placement eliminates any necessity for flipping the either substrate before bonding. Accordingly, the transition to the bonding process from the previous process can be easily and quickly completed.

The above-described embodiment may be varied without departing from the spirit of the present invention or the scope of the subjoined claims.

For example, the glass substrate 1L and the mother sealing substrate 30L are not limited to substrates on which sixteen display panels are formed simultaneously as exemplified in the above embodiment, but any arbitrary appropriate number of one or more display panels may be formed thereon.

The transistors for driving the EL element formed in the display region DP are not limited to those having the top gate structure as shown in FIG. 1 but may have a bottom gate structure or the like. More specifically, because the top layer (the mother sealing substrate 30L side) of the display region DP on the glass substrate 1L is covered with the cathode 16 as described above, the cathode 16 protects the inside of the display region DP from exposure to ultraviolet light. For this reason, there is no possibility that the channel regions of the transistors within the display region DP will be irradiated with ultraviolet light. However, when the electrode 16 is formed so as to correspond to the transparent electrode 11, it is preferable that the transistors within the display region DP have a top gate structure and are formed using gate materials capable of blocking ultraviolet light.

The EL display apparatus is not limited to those described above but may have a structure in which, for example, a source of the transistor is connected to the cathode instead of the anode. Further, the structure is not limited to the active matrix type. For example, a passive matrix structure may be employed as long as EL element electrodes on the sealing substrate side formed on the glass substrate are made of materials capable of blocking the ultraviolet light. In such a case, the present invention in which the sealing resin is irradiated with the ultraviolet light from the sealing substrate side for bonding may also be effectively applied.

At the time of bonding, it is not necessary to place the glass substrate 1L in such a manner that the bonding surface thereof matches the bonding surface of the mother sealing substrate 30L in a parallel direction while the glass substrate 1L is located above the sealing substrate 30. That is, the essential point is that the glass substrate 1L side is moved to perform alignment under the condition that the location of the mother sealing substrate 30L is fixed as well as pressure is applied in a direction toward the mother sealing substrate 30L side. As long as this is maintained, it is possible to have the structure such that the work surfaces of both of the substrates are slightly tilted to each other with reference to the parallel direction or the work surfaces of both of the substrates match in the vertical direction. In any structure, it is possible to align both of the substrates and apply pressure to them without blocking irradiation with the ultraviolet light and bonding can be completed with a simple structure.

The processes preceding to the bonding of the glass substrate 1L and the mother sealing substrate 30L are not limited to the series of processes of S101 to S103 and S200 to S202 listed in FIG. 4, but it is possible to make modifications that, for example, the sealing resin is applied to the glass substrate side as required. Further, the formation of EL materials using a mask by vacuum evaporation is not limited in its application to the emissive layer. For example, when the hole transporting layer 12, electron transporting layer 14 and/or electron injecting layer 15 are formed so as to vary in thickness of film from one primary color to another, these layers may be formed by similar technique using the mask, similarly to the case with a emissive layer.

The material of the mother sealing substrate 30L is not limited to glass. Any suitable material which allows ultraviolet light to transmit, such as a transparent resin or the like, may be used for the mother sealing substrate 30L.

Although an example sealing resin having a property of being curable with ultraviolet light is utilized in the embodiment and modifications described above, the present invention is not limited to use of such a resin. Any resin having a property of being curable with an appropriate wavelength of light which does not cause a temperature increase in the EL element may be used as the sealing resin. In such a case, the light should still be irradiated to the sealing resin through the sealing substrate, which therefore must allow that frequency of light to transmit. At that point, members having capability of blocking the ultraviolet light such as the gate electrodes or the like described in the embodiment should be replaced with elements blocking the appropriate wavelength of light.

Materials of the EL elements are not limited to those listed above. It is possible to use materials having electroluminescence capability, electric charge transporting capability, and capability of providing an electron and hole necessary for an electrode. These materials may be those known already or those which will be developed in future, and can be used singly or in combination.

In the example illustrating the embodiment, the cathode 16 formed in the top layer of the EL element is also formed by vacuum evaporation with the cathode forming surface facing down as is the case with forming other organic layers. However, the cathode 16 may be formed by sputtering or another method as appropriate to the material used for the electrodes. When the formation is performed by sputtering or the like, it is desirable that cathode materials are laminated with the cathode-forming surface facing upwards, in contrast to formation by vacuum evaporation. That is, in the process preceding to bonding of the glass substrate 1L and the mother sealing substrate 30L, the mother sealing substrate 30L is placed with the bonding surface facing upwards as described above and the glass substrate 1L is also placed with the bonding surface facing up, which is opposite to the state described above. It is in such a case necessary that one of the two substrates be flipped over in order to bond the substrates. In order to prevent the uncured sealing resin 40 applied on the upper surface of the mother sealing substrate 30L from dripping or falling before affixing, it is in such a case further preferable that mother sealing substrate 30L the glass substrate 1L, and not the mother sealing substrate 30L, be turned upside down before proceeding to the affixing process. In addition, it is necessary that the ultraviolet light to cure the sealing resin 40 be applied through the transparent support 50 and the mother sealing substrate 30L. If the support 50 is installed with mechanisms for moving and/or absorbing the mother sealing substrate 30L, the likelihood that the ultraviolet light will interfere with these mechanisms will be high. As a result, mechanisms designed specifically to avoid the interference of the ultraviolet light are required. However, interference with the ultraviolet light can be avoided by flipping over the bonding surface of the glass substrate 1L side so that it will face downward and then pressing the mother sealing substrate 30L from the glass substrate 1L side.

What is claimed is:

1. A method for manufacturing an electroluminescence display apparatus comprising stops of:

affixing an element substrate on which an electroluminescence element is formed and a sealing substrate fixedly placed so as to oppose an element-forming surface of said element substrate via a sealing resin between the two substrates;

pressing said element substrate toward fixedly placed said sealing substrate; and curing said sealing resin so as to bond said element substrate and said sealing substrate, wherein:

said element substrate is affixed with said sealing substrate after said sealing resin is applied on bonding surface of said sealing substrate at a location corresponding a location surrounding an element-forming region of said element substrate;

said sealing substrate, placed with the bonding surface thereof facing upwards when said sealing resin is applied, is installed on said support for the sealing substrate in such a manner that the bonding surface continues to face upwards after the completion of applying of said sealing resin;

a depression is preformed on said bonding surface side of said sealing substrate;

and a desiccant is applied in said depression of the sealing substrate.

* * * * *